(12) United States Patent
Sharp

(10) Patent No.: US 6,660,925 B1
(45) Date of Patent: Dec. 9, 2003

(54) THERMOELECTRIC DEVICE HAVING CO-EXTRUDED P-TYPE AND N-TYPE MATERIALS

(75) Inventor: Jeffrey W. Sharp, Richardson, TX (US)

(73) Assignee: Marlow Industries, Inc., Dallas, TX (US)

(*) Notice: Subject to any disclaimer, the term of this patent is extended or adjusted under 35 U.S.C. 154(b) by 0 days.

(21) Appl. No.: 09/872,394

(22) Filed: Jun. 1, 2001

(51) Int. Cl.$^7$ ............................ H01L 35/34; H01L 37/00
(52) U.S. Cl. ............................................. 136/201; 136/203
(58) Field of Search ............................... 136/200, 201, 136/203, 208; 264/104, 176.1, 148, 118, 171.11

(56) References Cited

U.S. PATENT DOCUMENTS

| | | | | |
|---|---|---|---|---|
| 4,980,730 A | * | 12/1990 | Mishima et al. | 257/98 |
| 4,994,878 A | * | 2/1991 | Levine et al. | |
| 5,064,476 A | | 11/1991 | Recine, Sr. | 136/201 |
| 5,171,372 A | | 12/1992 | Recine, Sr. | 136/203 |
| 5,576,512 A | | 11/1996 | Doke | 136/203 |
| 5,610,366 A | | 3/1997 | Fleurial et al. | 136/202 |
| 5,712,448 A | | 1/1998 | Vandersande et al. | 136/203 |
| 5,747,728 A | | 5/1998 | Fleurial et al. | 136/203 |
| 5,760,943 A | | 6/1998 | Kim et al. | 117/219 |
| 5,831,286 A | | 11/1998 | Fleurial et al. | 257/76 |
| 5,856,210 A | * | 1/1999 | Leavitt et al. | 438/55 |
| 5,892,656 A | * | 4/1999 | Bass | 361/699 |
| 6,069,312 A | | 5/2000 | Fleurial et al. | 136/236.1 |
| 6,288,312 B1 | | 9/2001 | Fleurial et al. | 136/205 |
| 6,342,668 B1 | | 1/2002 | Fleurial et al. | 136/201 |
| 6,388,185 B1 | | 5/2002 | Fleurial et al. | 136/205 |
| 6,458,319 B1 | | 10/2002 | Caillat et al. | 420/576 |
| 2001/0052357 A1 | * | 12/2001 | Kajihara et al. | |
| 2002/0014261 A1 | | 2/2002 | Caillat et al. | 136/205 |
| 2002/0175312 A1 | | 11/2002 | Fleurial et al. | 252/62.3 T |
| 2002/0176815 A1 | | 11/2002 | Fleurial et al. | 423/263 |
| 2002/0189661 A1 | | 12/2002 | Caillat et al. | 136/236.1 |
| 2003/0041892 A1 | | 3/2003 | Fleurial et al. | 136/227 |
| 2003/0047204 A1 | | 3/2003 | Fleurial et al. | 136/200 |
| 2003/0066476 A1 | | 4/2003 | Caillat et al. | 117/3 |

FOREIGN PATENT DOCUMENTS

| | | | | |
|---|---|---|---|---|
| WO | WO 95/04377 | 2/1995 | | H01L/35/18 |
| WO | WO 99/38219 | 7/1999 | | H01L/35/00 |
| WO | WO 00/08693 | 2/2000 | | H01L/35/34 |
| WO | WO 02/05366 A1 | 1/2002 | | H01M/4/88 |
| WO | WO 02/089224 A1 | 11/2002 | | H01L/35/24 |

* cited by examiner

Primary Examiner—Olik Chaudhuri
Assistant Examiner—Khiem Nguyen
(74) Attorney, Agent, or Firm—Baker Botts L.L.P.

(57) ABSTRACT

A method of forming thermoelectric materials includes combining at least one P-type extrusion with at least one N-type extrusion to form a first P/N-type billet. The P/N-type billet may be extruded to form a first P/N-type extrusion having at least one P-type region, and at least one N-type region. The P/N-type extrusion may be segmented into a plurality of P/N-type extrusion segments. In a particular embodiment, a plurality of the P/N-type extrusion segments may be combined to form a second P/N-type billet. The second P/N-type billet may be extruded to form a second P/N-type extrusion having a second plurality of P-type regions and a second plurality of N-type regions.

18 Claims, 7 Drawing Sheets

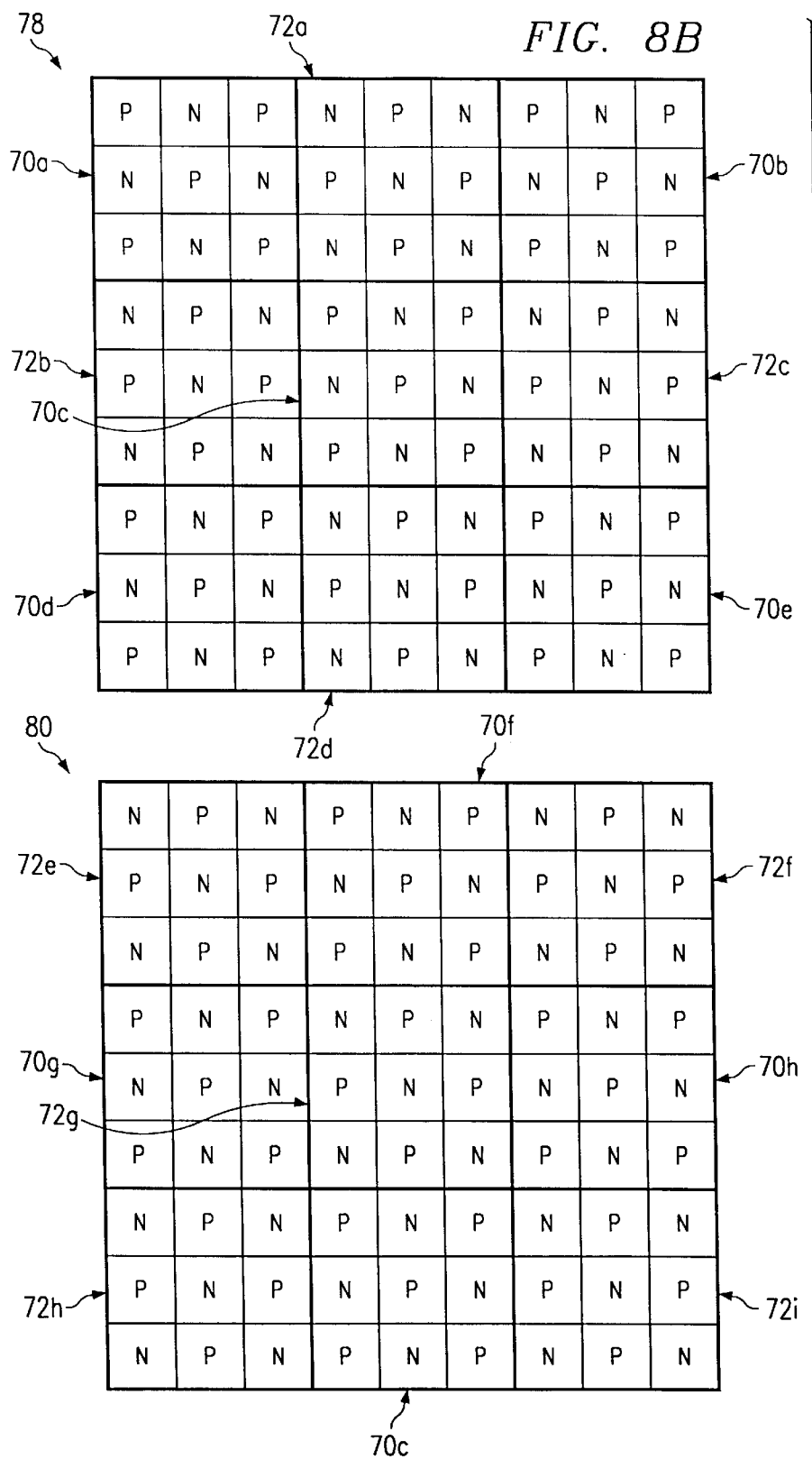

THERMOELECTRIC DEVICE HAVING CO-EXTRUDED P-TYPE AND N-TYPE MATERIALS

TECHNICAL FIELD OF THE INVENTION

The present invention relates to semiconductor materials having enhanced thermoelectric properties for use in fabricating thermoelectric devices and more particularly, to a thermoelectric device having co-extruded P-type and N-type material.

BACKGROUND OF THE INVENTION

The basic theory and operation of thermoelectric devices has been developed for many years. Presently available thermoelectric devices used for cooling typically include an array of thermocouples which operate in accordance with the Peltier effect. Thermoelectric devices may also be used for heating, power generation and temperature sensing.

Thermoelectric devices may be described as essentially small heat pumps which follow the laws of thermodynamics in the same manner as mechanical heat pumps, refrigerators, or any other apparatus used to transfer heat energy. A principal difference is that thermoelectric devices function with solid state electrical components (thermoelectric elements or thermocouples) as compared to more traditional mechanical/fluid heating and cooling components. The efficiency of a thermoelectric device is generally limited to its associated Carnot cycle efficiency reduced by a factor which is dependent upon the thermoelectric figure of merit (ZT) of materials used in fabrication of the associated thermoelectric elements. Materials used to fabricate other components such as electrical connections, hot plates and cold plates may also affect the overall efficiency of the resulting thermoelectric device.

Thermoelectric materials such as alloys of $Bi_2Te_3$, PbTe and BiSb were developed thirty to forty years ago. More recently, semiconductor alloys such as SiGe have been used in the fabrication of thermoelectric devices. Commercially available thermoelectric materials are generally limited to use in a temperature range between 200 K and 1300 K with a maximum ZT value of approximately one. Typically, a thermoelectric device incorporates both a P-type semiconductor and an N-type semiconductor alloy as the thermoelectric materials.

In order to manufacture a thermoelectric device, a billet of P-type material is extruded to form a P-type extrusion. Similarly, a billet of N-type material is extruded to form an N-type extrusion. The P and N-type extrusions are sliced into wafers, the wafers are sliced into elements, and the elements are mechanically loaded into a grid or "matrix" with the desired pattern and assembled upon a plate. P-type and N-type elements are typically arranged into rectangular arrays, in order to form a thermoelectric device. P-type and N-type legs alternate in both array directions. A metalization may be applied to the P-type wafers, N-type wafers, and/or the plate, in order to arrange the P-type wafers and the N-type wafers electrically in series and thermally in parallel.

For many thermoelectric devices, the elements dimensions are approximately 0.6 mm by 1.0 mm. Generally, the legs have a square cross-section perpendicular to the direction of current flow. Commonly, there are 18 to 36 pairs of P-type and N-type elements. Due to the size of the P-type and N-type elements, the elements are typically separated using a vibe loader for installation upon the plate according to a predetermined generally alternating pattern. This method is time-consuming and intricate, and requires specialized equipment and experienced operators.

SUMMARY OF THE INVENTION

In accordance with teachings of the present invention, the design and preparation of semiconductor materials for fabrication of thermoelectric devices has been substantially improved to provide enhanced manufacturing and operating efficiencies. More specifically, a billet including P-type material and N-type material is extruded in order to form an extrusion having both P-type regions and N-type regions. Accordingly, the extrusion may be sliced into wafers and processed for assembly of thermoelectric circuits and/or thermoelectric devices.

In accordance with the particular embodiment of the present invention, a method for forming a thermoelectric material includes combining at least one P-type extrusion with at least one N-type extrusion to form a first P/N-type billet. The P/N-type billet may be extruded to form a first P/N-type extrusion having at least one P-type region, and at least one N-type region. In a particular embodiment, the number of P-type regions and N-type regions may correspond to the number of P-type extrusions and N-type extrusions used to form the P/N-type billet.

In accordance with another embodiment of the present invention, the number of P-type regions and N-type regions may be unequal. However, depending upon the particular application and the desired end product, the number of P-type regions and N-type regions may be equal.

In accordance with yet another embodiment of the present invention, the P/N-type extrusion may be sliced in order to form wafers. The wafers may be metalized in order to couple the P-type regions and N-type regions electrically in series, and thermally in parallel.

Technical advantages of particular embodiments of the present invention include an extrusion having a predetermined number of P-type regions and a predetermined number of N-type regions. Accordingly, the extrusion may be sliced, processed, and assembled upon a plate in order to form a thermoelectric device. Assembly, therefore, does not require vibe loading and/or separation of individual P-type and N-type elements prior to assembly.

Another technical advantage of particular embodiments includes a method for forming an extrusion having a predetermined number of p-type regions and a predetermined number of N-type regions, arranged according to a predetermined configuration. Therefore, an extrusion may be formed to suit the particular application, and desired end product simplifying the assembly of a thermoelectric device.

BRIEF DESCRIPTION OF THE DRAWINGS

For a more complete understanding of the present invention and its advantages, reference is now made to the following descriptions, taken in conjunction with the accompanying drawings, in which:

FIG. 8B is a schematic drawing illustrating cross-sections through extrusions formed using segmented portions of the extrusions of FIG. 8A.

DETAILED DESCRIPTION OF THE INVENTION

Figure 1:
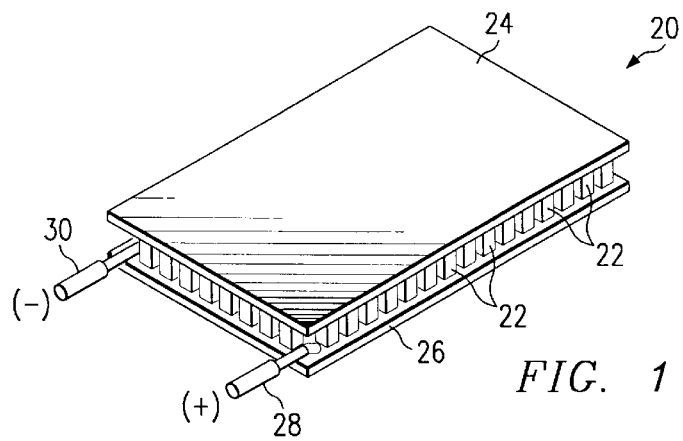
FIG. 1 is a schematic drawing showing an isometric view of a thermoelectric device having multiple thermoelectric elements which may be fabricated from semiconductor materials with crystal lattice structures incorporating teachings of the present invention.

FIG. 1 illustrates a thermoelectric device 20 including a plurality of thermoelectric elements (sometimes referred to as "thermocouples") 22 disposed between a cold plate 24 and a hot plate 26. Electrical connections 28 and 30 are provided to allow thermoelectric device 20 to be electrically coupled with an appropriate source of DC electrical power. In a particular embodiment of the present invention, thermoelectric elements 22 may be formed from a single extrusion including both P-type and N-type regions. Therefore, manufacturing, handling, and assembly of thermoelectric device 20 is simplified, and performance is enhanced.

Thermoelectric device 20 may be used as a heater, cooler, electrical power generator and/or temperature sensor. If thermoelectric device 20 were designed to function as an electrical power generator, electrical connections 28 and 30 would represent the output terminals from such a power generator operating between hot and cold temperature sources. The thermoelectric figure of merit (ZT) of thermoelectric device 20 will vary depending upon the type of use. For example, thermoelectric device 20 may have a first value of ZT when used as a cooler and a second, different value of ZT when used as an electrical power generator.

Figure 2:
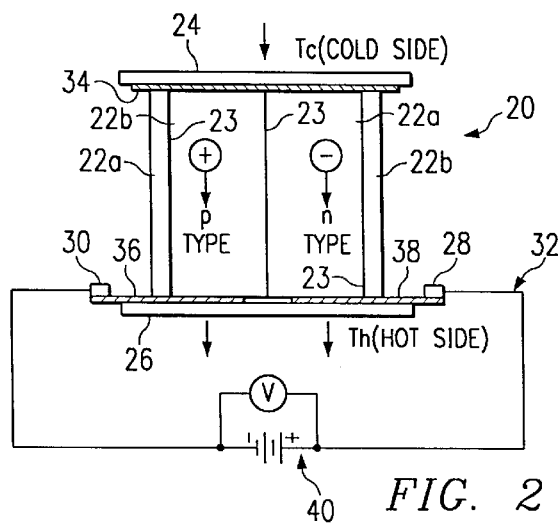
FIG. 2 is an electrical schematic drawing of one thermocouple of the thermoelectric device of FIG. 1.

FIG. 2 is a schematic representation of an electrical circuit 32 of single stage thermoelectric device 20. Electrical circuit 32 may also be incorporated into thermoelectric elements or thermocouples to convert heat energy into electrical energy. Electric circuit 32 generally includes two or more thermoelectric elements 22 fabricated from dissimilar semiconductor materials such as N-type thermoelectric elements 22a and P-type thermoelectric elements 22b. Thermoelectric elements 22 are typically configured in a generally alternating N-type element to P-type element arrangement. A barrier 23 is formed between each P-type element 22a and adjacent N-type elements 22b In many thermoelectric devices, semiconductor materials with dissimilar characteristics are connected electrically in series and thermally in parallel. The phrase "semiconductor materials" is used in this application to include semiconductor compounds, semiconductor alloys and mixtures of semiconductor compounds and alloys formed in accordance with teachings of the present invention for use in fabricating thermoelectric elements and thermoelectric devices.

Examples of thermoelectric devices and methods of fabrication are shown in U.S. Pat. No. 5,064,476 entitled Thermoelectric Cooler and Fabrication Method; U.S. Pat. No. 5,171,372 entitled Thermoelectric Cooler and Fabrication Method; and U.S. Pat. No. 5,576,512 entitled Thermoelectric Apparatus for Use With Multiple Power Sources and Method of Operation.

N-type semiconductor materials generally have more electrons than necessary to complete the associated crystal lattice structure. P-type semiconductor materials generally have fewer electrons than necessary to complete the associated crystal lattice structure. The "missing electrons" are sometimes referred to as "holes." The extra electrons and extra holes are sometimes referred to as "carriers." The extra electrons in N-type semiconductor materials and the extra holes in P-type semiconductor materials are the agents or carriers which transport or move heat energy between cold side or cold plate 24 and hot side or hot plate 26 through thermoelectric elements 22 when subject to a DC voltage potential. These same agents or carriers may generate electrical power when an appropriate temperature difference is present between cold side 24 and hot side 26.

In thermoelectric device 20, alternating thermoelectric elements 22a, and 22b of N-type and P-type semiconductor materials may be sliced from a single extrusion having both P-type regions and N-type regions separated by barriers 23, and have their ends connected by electrical conductors such as 34, 36 and 38. Conductors 34, 36 and 38 may be metalizations formed on thermoelectric elements 22a, 22b and/or on the interior surfaces of plates 24 and 26. Ceramic materials are frequently used to manufacture plates 24 and 26 which define in part the cold side and hot side, respectively, of thermoelectric device 20. Commercially available thermoelectric devices which function as a cooler generally include two ceramic plates with separate P-type and N-type thermoelectric elements formed from bismuth telluride ($Bi_2$, $Te_3$) alloys disposed between the ceramic plates and electrically connected with each other.

When DC electrical power from power supply 40 is properly applied to thermoelectric device 20 heat energy will be absorbed on cold side 24 of thermoelectric elements 22 and will be dissipated on hot side 26 of thermoelectric device 20. A heat sink or heat exchanger (sometimes referred to as a "hot sink") may be attached to hot plate 26 of thermoelectric device 20 to aid in dissipating heat transferred by the associated carriers and phonons through thermoelectric elements 22 to the adjacent environment. In a similar manner, a heat sink or heat exchanger (sometimes referred to as a "cold sink") may be attached to cold side 24 of thermoelectric device 20 to aid in removing heat from the adjacent environment. Thus, thermoelectric device 20 may sometimes function as a thermoelectric cooler when properly connected with power supply 40. However, since thermoelectric devices are a type of heat pump, thermoelectric device 20 may also function as a heater, power generator, or temperature sensor.

Figure 3A:
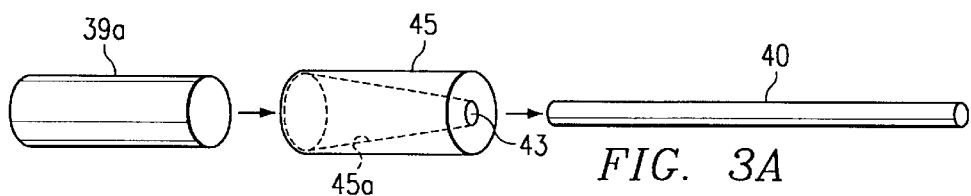
FIG. 3A is a schematic drawing illustrating a P-type extrusion formed by placing a billet into an extruder.
Figure 3B:
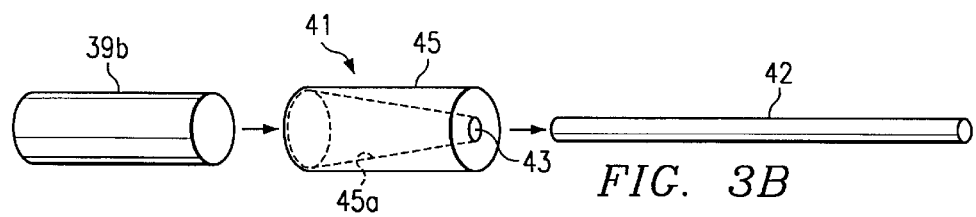
FIG. 3B is a schematic drawing illustrating an N-type extrusion formed by placing a billet into an extruder.

FIGS. 3A and 3B illustrate a P-type extrusion 40 and a N-type extrusion 42 formed using extruder 41. P-type extrusion 40 is formed from a typical extrusion process in which semi-soft, billet 39a of P-type material is heated and forced through orifice 43 of die 45 to produce a continuously formed piece in the shape of the desired product. In the illustrated embodiment, orifice 43 includes a circular configuration, and forms a generally cylindrical P-type extrusion 40.

Similarly, N-type extrusion 42 is formed from an extrusion process in which a billet 39b of semi-soft N-type material is heated and forced through the orifice 43 of die 45 to produce a continuously formed piece in the shape of the desired product. In the illustrated embodiment, P-type extrusion 40 and N-type extrusion 42 each includes circular cross-sections. However, various other configurations are available for use within the present invention. Such configurations include, but are not limited to, square and/or rectangular configurations.

P-type extrusion 40 and N-type extrusion 42 of the illustrated embodiment are formed by loading $1^{1/8}$ inch diameter billets 39a, 39b of P-type material and N-type material, respectively, into an extruder where it is reduced to a cross-section of approximately ⅜ inches. In accordance with the teachings of the present invention, P-type extrusion 40 and N-type extrusion 42 may be segmented and fed back into the extruder as the "billet" for a second extrusion. This process may be further repeated as desired, in order to form one or more extrusions having a plurality of N-type material regions and a plurality of P-type material regions.

Figure 4A:
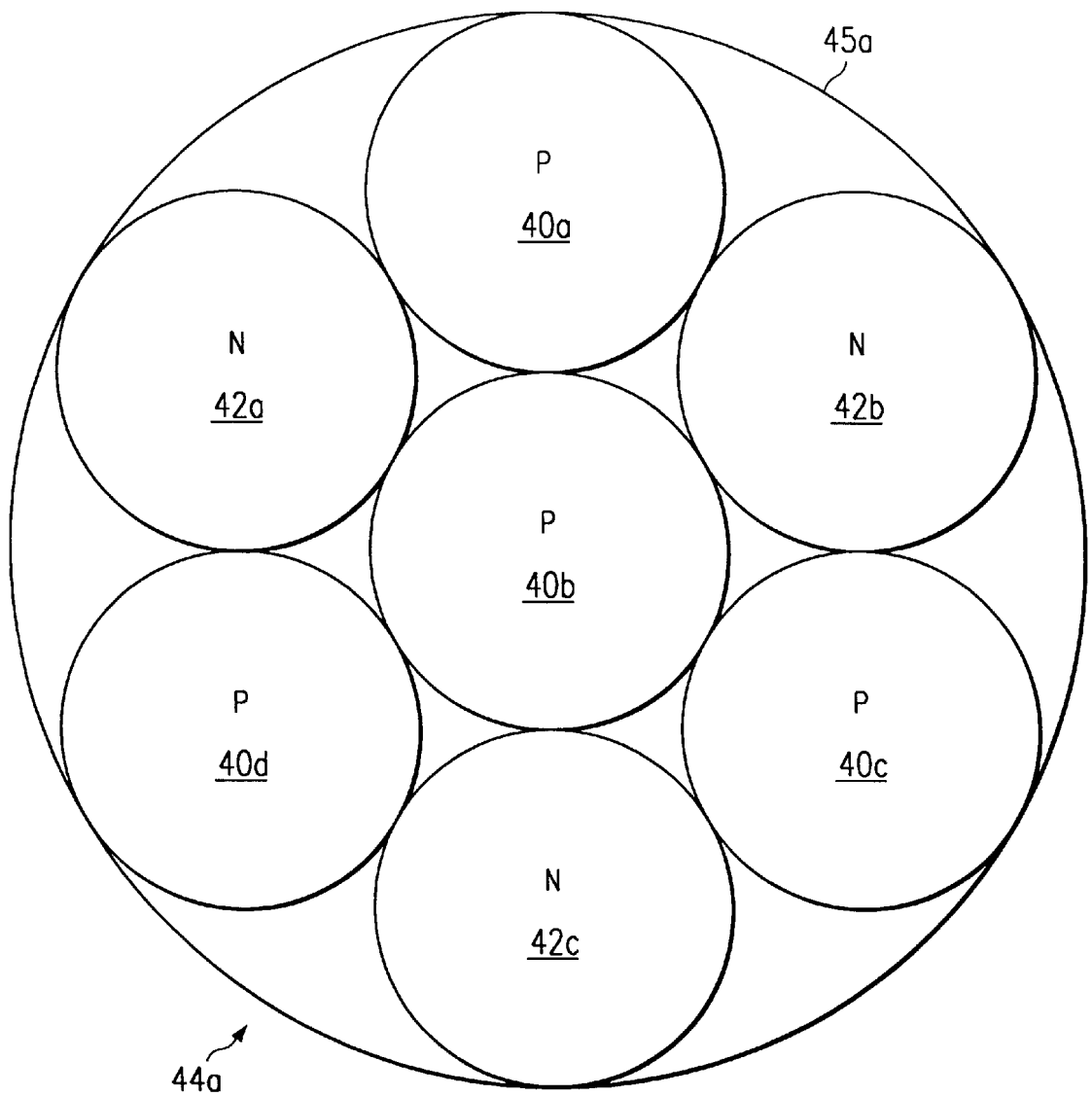
FIG. 4A is a schematic drawing illustrating a cross-section through a billet formed using various segments of the extrusions of FIGS. 3A and 3B.
Figure 4B:
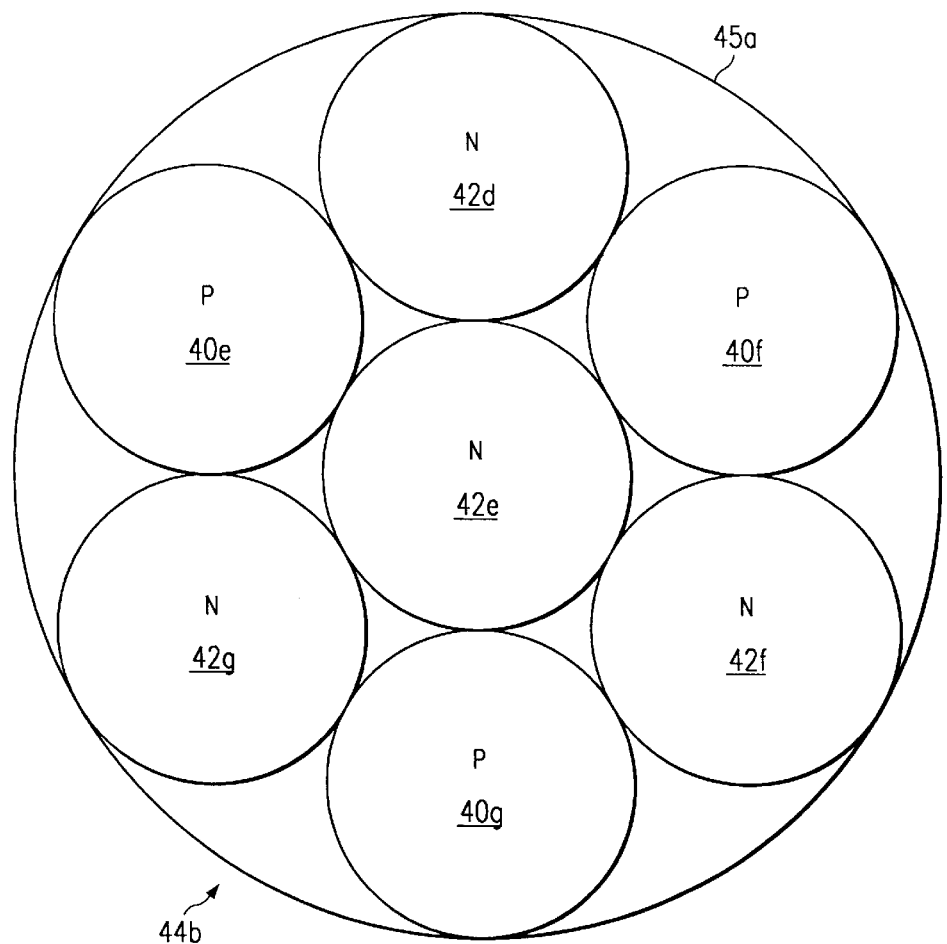
FIG. 4B is a schematic drawing illustrating a cross-section through a billet formed using various segments of the extrusions of FIGS. 3A and 3B.

FIGS. 4A and 4B illustrate cross-sections through segmented extrusion portions of P-type extrusion 40, including P-type extrusion 40a–40g. Similarly, N-type extrusions 42a–42g represent segmented portions of N-type extrusion 42. P-type extrusions 40a–40g and N-type extrusion 42a–42g may be combined in a predetermined configuration and loaded into extruder 41. In the illustrated embodiment of FIG. 3B, extruder 41 includes an interior wall 45a having an approximately $1^{1/8}$ inch diameter. Since each P-type extrusion 40a–40g and N-type extrusion 42a–42g are approximately ⅜ inches in diameter, seven segmented extrusion portions may be combined and extruded in one or more extrusion processes. A total of four P-type extrusions 40a–40d and three N-type extrusions 42a–42c are loaded into extruder 41 and formed into a billet as illustrated on FIG. 4A. During the next extrusion process, four N-type extrusions 42d–42g, and three P-type extrusions 40e–40g are formed into a billet 44b and loaded into extruder 41, as illustrated in FIG. 4B.

It will be recognized by those of ordinary skill in the art that the number, size and/or configuration of each segmented extrusion portion may be significantly modified within the teachings of the present invention. Furthermore, the number of extrusion processes performed may be selected to suit the particular application and desired end finished product. Each subsequent extrusions process may be performed upon a billet comprising P-type materials, N-type materials, and/or hybrid P and N-type materials.

Figure 5A:
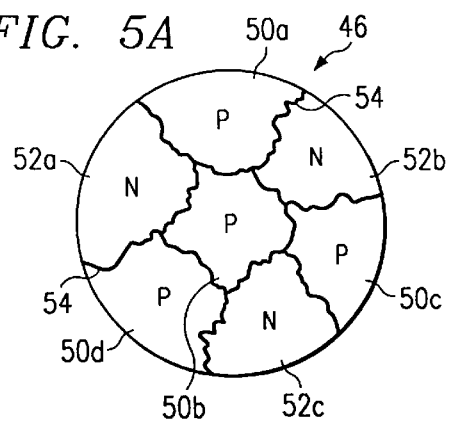
FIG. 5A is a schematic drawing illustrating a cross-section through an extrusion formed from the billets of FIGS. 4A and 4B.
Figure 5B:
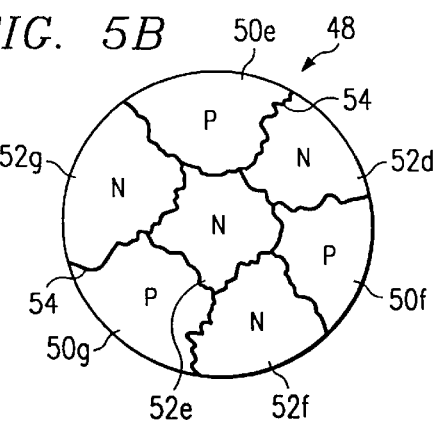
FIG. 5B is a schematic drawing illustrating a cross-section through an extrusion formed from the billets of FIGS. 4A and 4B.

FIGS. 5A and 5B illustrate cross-sections through P/N-type extrusions 46 and 48 formed from billets 44a and 44b illustrated in FIGS. 4A and 4B, respectively. P/N-type extrusion 46 includes four P-type regions 50a–50d and three N-type regions 52a–52c. P-type regions 50a–50d correspond to P-type extrusions 40a–40d of FIG. 4A. Similarly, N-type regions 52a–52c correspond to N-type extrusions 42a–42c of FIG. 4A. Each P-type region 50a–50d and N-type region 52a–52c is separated from adjacent P-type and/or N-type regions by a plurality of barriers 54. As will be described later in more detail, each barrier 54 may include a passivating agent operable to, at least in part, thermally, chemically and/or electrically isolate each P-type portion and N-type portion from adjacent P-type and N-type portions. The configuration of each P-type region 50a–50d and N-type region 52a–52c is consistent with the deformation that occurs during the extrusion process as the billets of FIGS. 4A and 4B are formed and compressed from an approximately $1^{1/8}$ inch diameter billet 44a to an approximately ⅜ inch diameter extrusion 46.

P/N-type extrusion 48 includes three P-type regions 50e–50g, and four N-type regions 52d–52g. P-type regions 50e–50g correspond to P-type extrusions 40e–40g of FIG. 4B. Similarly, N-type regions 52d–52g correspond to N-type extrusions 42d–42g of FIG. 4B. Barriers 54 separate P-type 50e–50g and N-type 52d–52g regions from adjacent P-type and/or N-type regions. In the next step, P/N-type extrusion 46 and P/N-type extrusion 48 may be segmented and used as "billet" in the next stage.

Figure 6A:
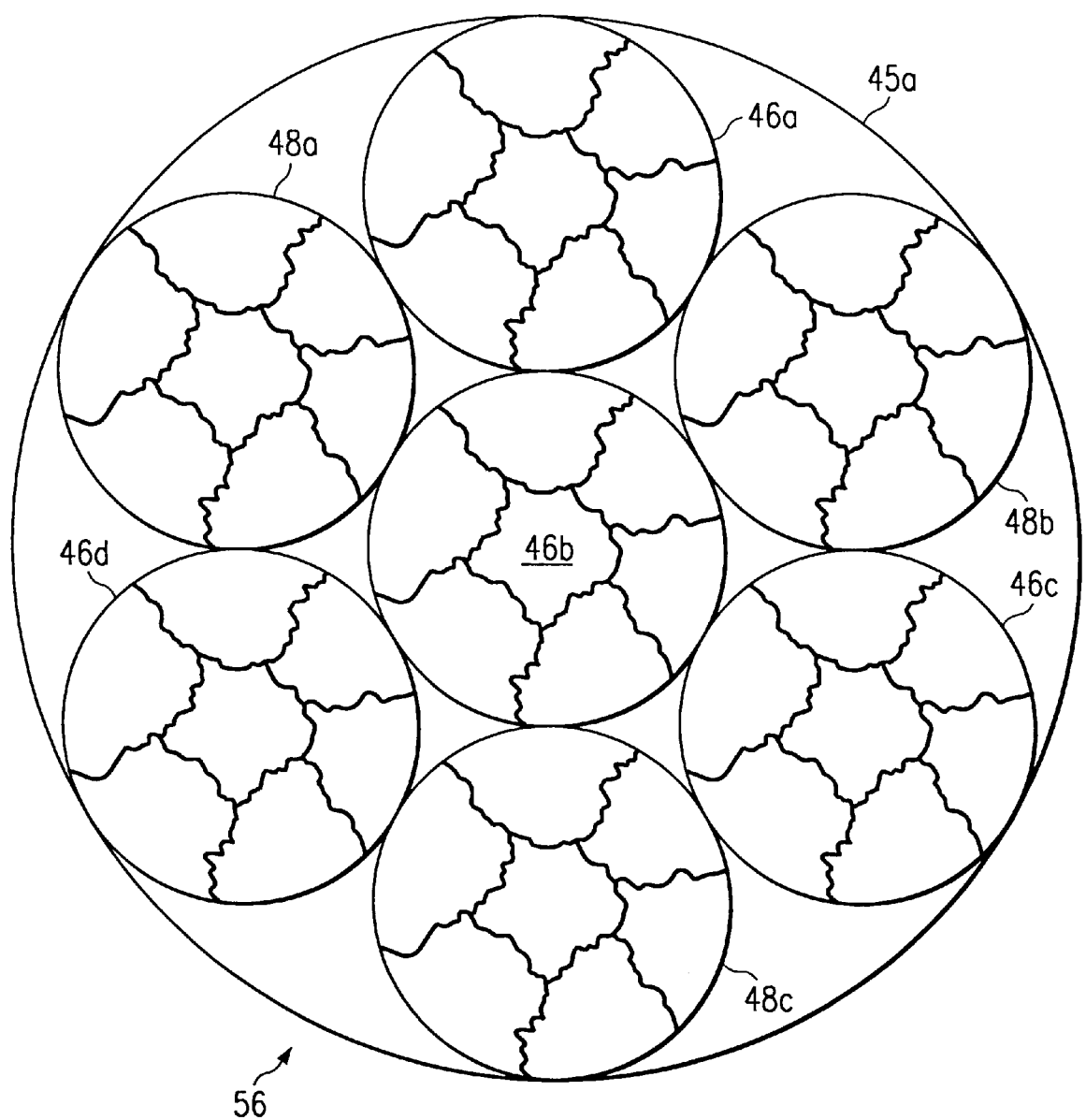
FIG. 6A is a schematic drawing illustrating a cross-section through a billet formed from portions of the extrusions of FIGS. 5A and 5B.
Figure 6B:
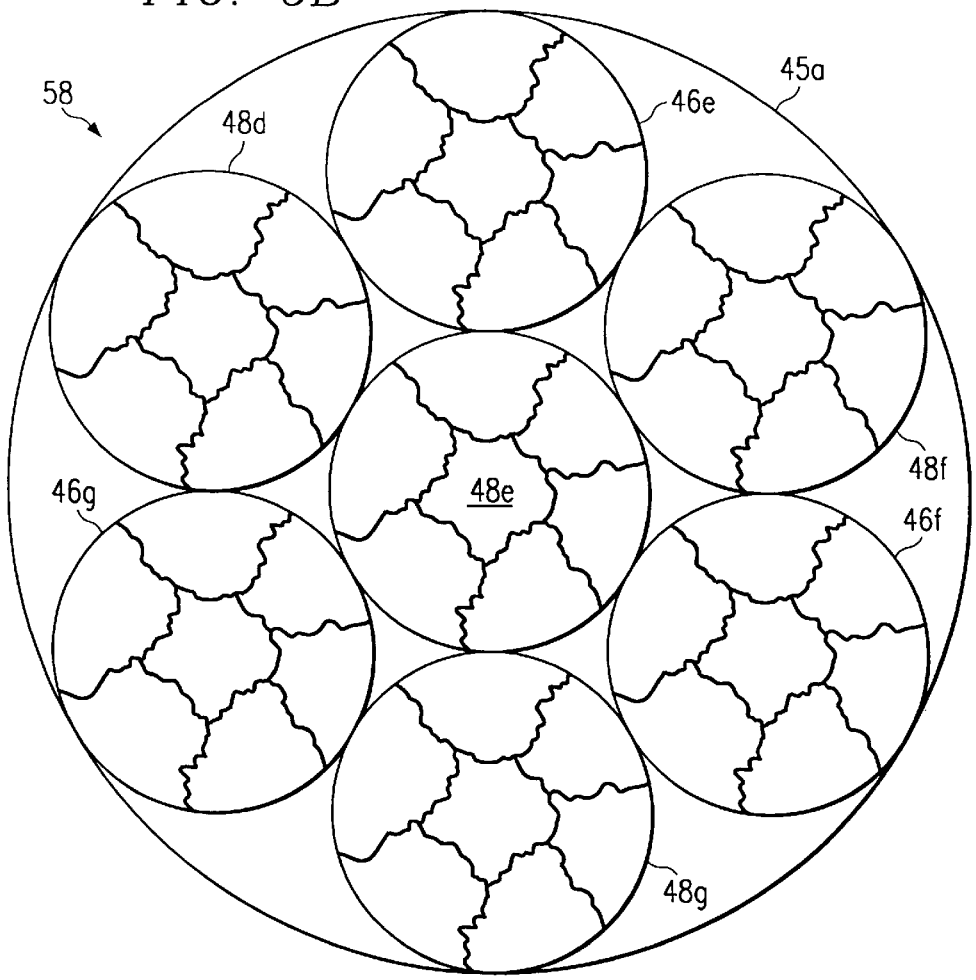
FIG. 6B is a schematic drawing illustrating a cross-section through a billet formed from portions of the extrusions of FIG. 5A and 5B.

FIGS. 6A and 6B illustrate another stage of the process. Billets 56 and 58 are fed into die 45. Billet 56 includes four P/N-type extrusions 46a–46d and three P/N-type extrusions 48a–48c. Similarly, billet 58 includes three P/N-type extrusions 46e–46g and four P/N-types extrusions 48d–48g. Billet 56 and 58 are extruded within extruder 41, and therefore compressed and reduced from an approximately $1^{1/8}$ inch aggregate diameter to an approximately ⅜ inch diameter extrusion, as illustrated in FIGS. 7A and 7B.

Figure 7A:
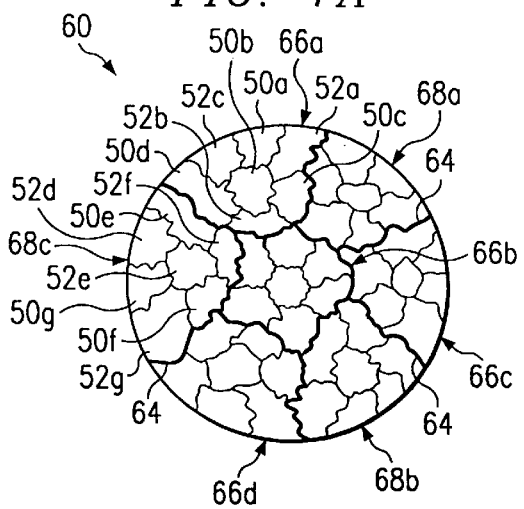
FIG. 7A is a schematic drawing illustrating a cross-section through an extrusion formed from the billets of FIGS. 6A and 6B.
Figure 7B:
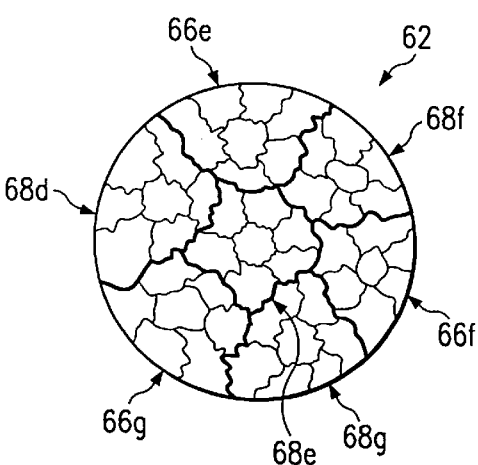
FIG. 7B is a schematic drawing illustrating a cross-section through an extrusion formed from the billets of FIGS. 6A and 6B.

FIGS. 7A and 7B illustrate cross-sections through extrusions 60 and 62 which are the product of extruding billets 56 and 58 of FIGS. 6A and 6B. Extrusion 60 includes a plurality of P/N-type regions 66a–66d and a plurality of P/N-type regions 68a–68c. Each P/N-type region 66a–66d includes a plurality of P-type regions 50a–50d and a plurality of N-type regions 52a–52c, since billet 56 is formed from segmented portions of extrusions 46 and 48. Barriers 64 are formed between each adjacent P/N-type extrusion 66a–66d and P/N-type extrusion 68a–68c. For illustrative purposes, barriers 64 are illustrated in dark lines in FIGS. 7A and 7B.

Similar to barriers 54, barriers 64 may include a passivating agent. The configuration of P/N type regions 66, P/N-type regions 68, P-type regions 50, N-type regions 52, boundaries 54, and boundaries 64 represent the compression and deformation experienced from billets 56 and 58 being reduced from approximately $1^{1/8}$ inch diameter to approximately ⅜ inch diameter extrusions.

In the illustrated embodiment of FIGS. 7A and 7B, P/N-type extrusion 60 includes a total of four P/N-type regions 66a–66d and three P/N-type regions 68a–68c. Each P/N-type region 66a–66d includes four P-type regions 50a–50d and three N-type regions 52a–52c. Each P/N-type region 68a–68c includes three P-type regions 50e–50g and four N-type regions 52d–52g. Therefore, P/N-type extrusion 60 includes a total of twenty five P-type regions and 24 N-type regions.

P/N-type extrusion 62 includes three P/N-type extrusion segments 66e–66g and four P/N-type extrusion segments 68d–68g. Each P/N-type extrusion segment 66e–66g includes four P-type regions 50a–50d and three N-type regions 52a–52c, and each extrusion segment 68d–68g includes three P-type regions 50e–50g, and four N-type regions 52d–52g. Therefore, P/N-type extrusion 62 includes 24 P-type regions and twenty five N-type regions.

The number, size and/or configurations of P-type extrusions 40, N-type extrusions 42, P/N-type extrusions 46, 48, 60 and/or 62 may be significantly modified within the teachings of the present invention. Therefore the final product of the process described above may include any number, size, and/or configuration of P-type regions 50, N-type regions 52, and/or P/N-type regions 66 and 68.

Figure 8A:
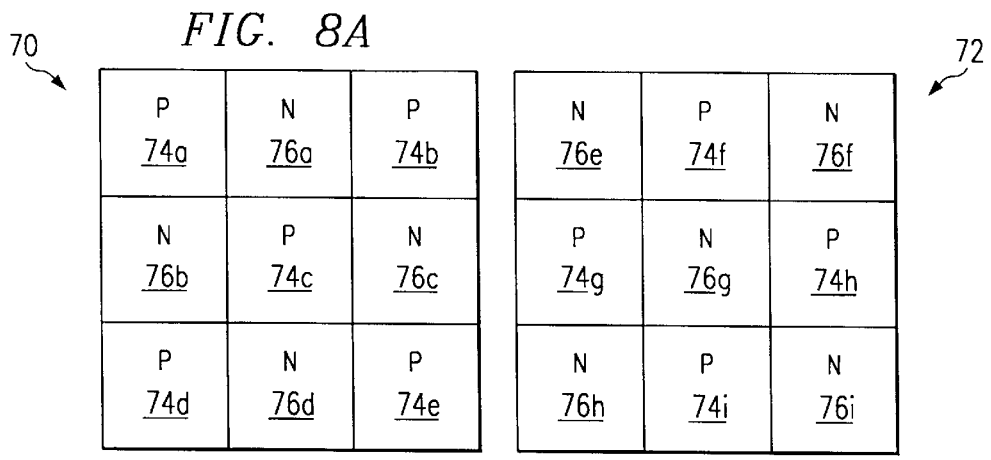
FIG. 8A is a schematic drawing illustrating cross-sections through extrusions having P-type regions and N-type regions.

FIG. 8A illustrates cross-sections through P/N-type extrusions 70 and 72. P/N-type extrusion 70 is formed generally according to the process described above, with the exception of the shape of the extruder chamber and associated orifice. P/N-type extrusion 70 is the product of an extruder having a rectangular (e.g. square) orifice. Therefore, P/N-type extrusion 70 includes five P-type regions 74a–74e, and four N-type regions 76a–76d. Similarly, P/N-type extrusion 72 includes four P-type regions 74f–74i and five N-type regions 76e–76i. Each P/N-type extrusion 70 and 72 may be segmented for use as billet and another extrusion process.

FIG. 8B illustrates cross-sections through two P/N-type extrusions 78 and 80 formed by extruding billets which include segmented portions of P/N-type extrusions 70 and 72. P/N-type extrusion 78 includes five segmented portions 70a–70e of P/N-type extrusion 70 and four segmented portions 72a–72d of P/N-type extrusion 72. The boundaries between segmented portions 70a–70e and 72a–72d are shown in dark lines in FIG. 8B, for illustrative purposes. Each segmented portion 70a–70e includes five P-type regions 74a–74e and four N-type regions 76a–76d. Each segmented portion 72a–72d includes four P-type regions 74f–74i and five N-type regions 76e–76i. Therefore, P/N-type extrusion 78 includes a total of forty-one P-type regions and forty N-type regions.

P/N-type extrusion 80 of FIG. 8B includes four segmented portions 70f–70i of P/N-type extrusion 70, and five segmented portions 72e–72i of P/N-type extrusion 72. The boundaries between segmented portions 70f–70i and 72e–72i of P/N-type extrusion 80 are shown in dark lines in FIG. 8B, for illustrative purposes. P/N-type extrusion 80, therefore, has a total of forty-one N-type regions and forty P-type regions.

It will be obvious to a person of ordinary skill in the art that the teachings of the present invention may be used to produce a P/N-type extrusion of practically any size and/or configuration and having practically any number of P-type regions and/or N-type regions arranged in a predetermined configuration. Such P/N-type extrusions, including P/N-type extrusions 70, 72, 78 and/or 80, may be sliced into wafers and used in the assembly of thermoelectric devices.

In particular embodiments of the present invention, each P-type extrusion 40, N-type extrusion 42, P/N-type extrusion 46, 48, 60, 62, 70, 72, 78 and/or 80 may be coated with a surface passivating agent prior to forming the billet and/or an extrusion process. The passivating agent may be operable to, at least in part, electrically, chemically and/or thermally isolate each P-type and N-type region from adjacent P-type and N-type regions. In the illustrated embodiments, boron nitride powder is applied prior to forming each billet, and forms barriers 54 and 64. However, other passivating agents and application techniques are available for use within the teachings of the present invention. For example, a passivating agent having a relatively low thermal conductivity is appropriate to form barriers 54 and 64. The passivating agent may be one or more of various chemically inert electrical insulators/thermal insulators.

Figure 9:
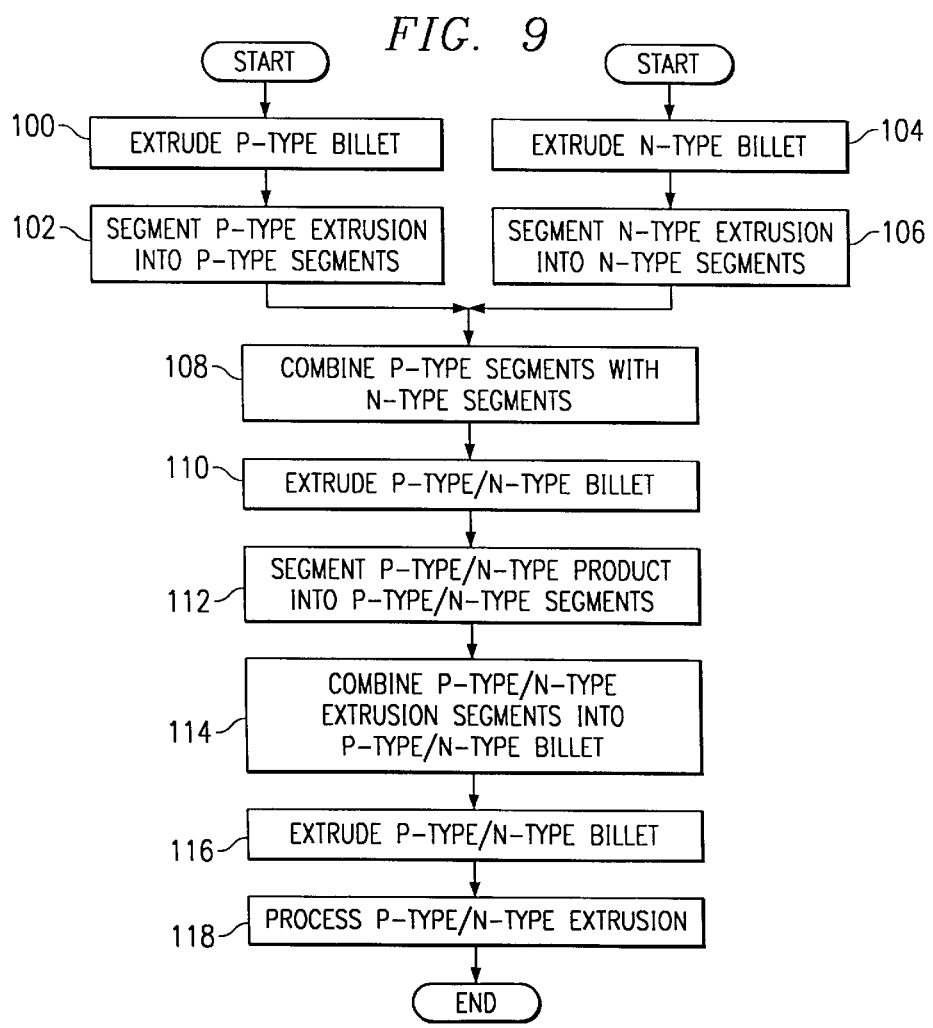
FIG. 9 is a block diagram illustrating a method for forming a thermoelectric device, in accordance with a particular embodiment of the present invention.

FIG. 9 illustrates a method for forming a thermoelectric element, in accordance with a particular embodiment of the present invention. The method begins at step 100 where a billet of P-type material is extruded to form a P-type extrusion. At step 102, the P-type extrusion is segmented into a plurality of P-type extrusion segments. The length of the P-type segments may be selected to correspond to the approximate length of the particular extrusion chamber being used.

Next, at step 104, a billet of N-type materials is extruded in order to form an N-type extrusion. At step 106, the N-type extrusion is segmented into a plurality of N-type extrusion segments. The P-type extrusion segments of step 102 and N-type extrusion of step 106 may be combined for further processing.

In a particular embodiment of the present invention, respective P-type and N-type material billets each having a $1^{1/8}$ inch diameter may be used to produce corresponding $3/8$ inch diameter extrusions approximately thirty inches long. Accordingly, seven extrusion segments of each P-type and N-type extrusions are formed.

At step 108, one or more P-type extrusion segments are combined with one or more N-type extrusion segments, in order to form a billet. The billet may include any number of P-type segments and any number of N-type segments. The ratio of P-type segments to N-type segments may be varied significantly depending upon the particular application and desired end product. At step 110, the billet including P-type segments and N-type segments is extruded to form a P/N-type extrusion. The P/N-type extrusion is segmented at step 112, into a plurality of P/N-type extrusion segments.

At step 114, a plurality of P/N-type extrusion segments are combined to form a P/N-type billet for further extruding. The P/N-type extrusion segments may be identical in configuration, representing segments of the P/N-type extrusion of step 110. However, P/N-type extrusion segments with different cross-sections and configurations may be combined at this step depending upon the particular application and desired end product. The cross-section and configuration of various P/N-type extrusion segments used in this step may be selected in order to achieve an extrusion having a pre-determined number of P-type regions and N-type regions.

Next, at step 116, the billet including a plurality of P/N-type extrusion segments is extruded in order to form a P/N-type extrusion. The P/N-type extrusion of step 116 will include a plurality of P-type regions and a plurality of N-type regions corresponding to the number of P-type extrusion segments, N-type extrusion segments and/or P/N-type extrusion segments selected above at steps 108 and 114. The P/N-type extrusion of step 116 may be segmented to form the billet for another extrusion process, depending upon the specific application and desired end product.

Finally, at step 118, the P/N-type extrusion of step 116 is processed to form one or more thermoelectric elements. The processing may also include the assembly of a thermoelectric device.

The P/N-type extrusion of step 116 may be sliced into wafers of a predetermined thickness. For example, the illustrated embodiment envisions slicing the P/N-type extrusion into 0.040 inch thickness wafers so that the wafers may be electrically coupled with a plate. The plate may include a patterned metalization in order to form a thermoelectric circuit. In accordance with one embodiment of the present invention, the wafers may be "diced" prior to assembly of the thermoelectric device, in order to separate the P-type material from the N-type material. Alternatively, if a sufficient barrier is formed between the P-type and N-type material, the wafers may be coupled with both plates without dicing.

In a particular embodiment of the present invention, the thermoelectric circuit has individual legs arranged electrically in series and thermally in parallel. For example, using the process described above, a circuit having 24 P-N couples may be formed from wafers sliced from the products of FIGS. 7A and 7B. One or more circuits may be coupled with hot and cold plates in order to form a thermoelectric element similar to thermoelectric device 20 of FIG. 1.

Although the present invention has been described in several embodiments, a myriad of changes and modifications may be suggested to one skilled in the art, and it is intended that the present invention encompass such changes and modifications as fall within the scope of the present appended claims.

What is claimed is:

1. A method of forming a thermoelectric material, comprising:
   combining at least one P-type extrusion with at least one N-type extrusion to form a first P/N-type billet; and
   extruding the first P/N-type billet to form a first P/N-type extrusion having at least one P-type region, and at least one N-type region.

2. The method of claim 1, further comprising extruding at least one billet including P-type material to form the at least one P-type extrusion.

3. The method of claim 1, further comprising extruding at least one billet including N-type material to form the at least one N-type extrusion.

4. The method of claim 1, further comprising:
   segmenting the first P/N-type extrusion into a plurality of P/N-type extrusion segments;
   combining a plurality of the P/N-type extrusion segments to form a second P/N-type billet; and
   extruding the second P/N-type billet to form a second P/N-type extrusion having a second plurality of P-type regions and a second plurality of N-type regions.

5. The method of claim 1, further comprising:
   combining at least a portion of the first P/N-type extrusion with at least one of a second P/N-type extrusion to form a second P/N-type billet; and
   extruding the second P/N-type billet to form a third P/N-type extrusion.

6. The method of claim 1, wherein:
   the plurality of P-type extrusions comprises a first number of extrusions;
   the plurality of N-type extrusions comprises a second number of extrusions; and
   the first number of extrusions is greater than the second number of extrusions.

7. The method of claim 1, wherein:
   the plurality of P-type extrusions comprises a first number of extrusions;
   the plurality of N-type extrusions comprises a second number of extrusions; and
   the first number of extrusions is equal to the second number of extrusions.

8. The method of claim 1, wherein:
   the plurality of P-type extrusions comprises a first number of extrusions;
   the plurality of N-type extrusions comprises a second number of extrusions; and
   the first number of extrusions is less than the second number of extrusions.

9. The method of claim 1, wherein each of the at least one P-type extrusions comprises a first circular cross-section, and each of the at least one N-type extrusions comprise a second circular cross-section.

10. The method of claim 1, wherein each of the at least one P-type extrusions comprise a first rectangular cross-section, and each of the at least one N-type extrusions comprise a second rectangular cross-section.

11. The method of claim 1, further comprising applying a passivating agent to a surface of at least one of the at least one P-type extrusions and the at least one N-type extrusions.

12. The method of claim 4, further comprising applying a passivating agent to at least one of the P/N-type extrusions.

13. The method of claim 12, wherein the passivating agent comprises boron nitride powder.

14. The method of claim 5, further comprising:
   combining at least one of the third P/N-type extrusions with at least one of a fourth P/N-type extrusion to form a third P/N-type billet; and
   extruding the third P/N-type billet to form a fifth P/N-type extrusion.

15. A method of forming a thermoelectric circuit, comprising:
   extruding a P/N-type billet to form a P/N-type extrusion having a first plurality of P-type regions and a first plurality of N-type regions;
   slicing the P/N-type extrusion into a plurality of P/N-type wafers;
   applying a metalization to at least one of the plurality of P/N-type wafers; and
   bonding the wafer to a plate having a patterned metalization which forms a thermoelectric circuit.

16. The method of claim 15, wherein the thermoelectric circuit includes individual legs arranged electrically in series and thermally in parallel.

17. A method of forming a thermoelectric device, comprising:
   extruding a P/N-type billet to form a P/N-type extrusion having a first plurality of P-type regions and a first plurality of N-type regions;
   slicing the P/N-type extrusion into a plurality of P/N-type wafers;
   applying a metalization to at least a subset of the P-type regions and N-type regions;
   coupling the thermoelectric circuit with a first plate at a first end of the thermoelectric circuit, the first plate having a first patterned metalization, to form a thermoelectric circuit wherein the subset of P-type regions and N-type regions are arranged electrically in series and thermally in parallel; and
   coupling the thermoelectric circuit with a second plate at a second end of the thermoelectric circuit, the second plate having a second patterned metalization.

18. The method of claim 17, further comprising dicing the wafer on the first plate prior to coupling the thermoelectric circuit with the second plate.

* * * * *